Figure 1:
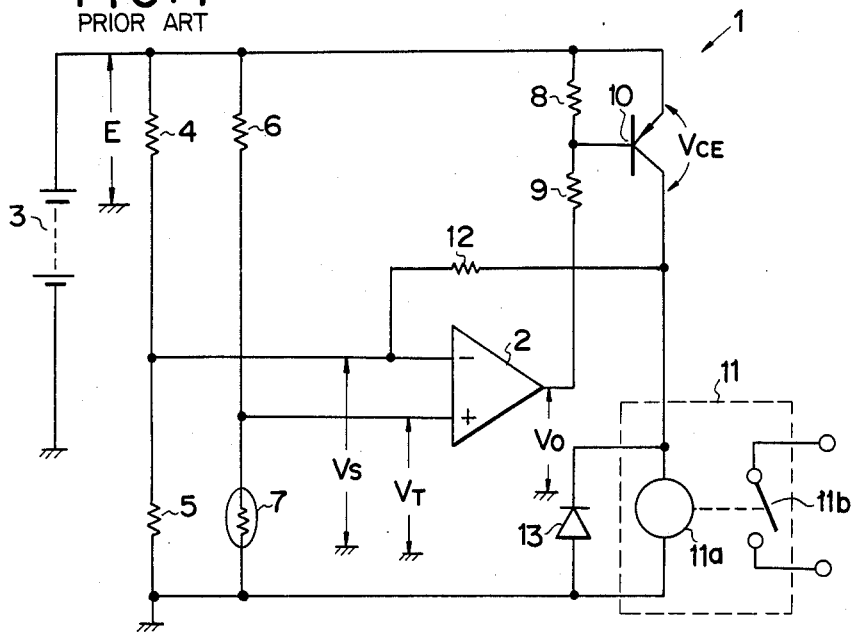

United States Patent [19]
Arai et al.

[11] Patent Number: 4,623,798
[45] Date of Patent: Nov. 18, 1986

[54] THERMOSENSITIVE SWITCHING CIRCUIT HAVING COMPARATOR WITH OPEN COLLECTOR OUTPUT

[75] Inventors: Kenji Arai, Saitama; Kazumasa Kurihara, Gunma, both of Japan

[73] Assignee: Diesel Kiki Co., Ltd., Japan

[21] Appl. No.: 407,915

[22] Filed: Aug. 13, 1982

[30] Foreign Application Priority Data

Aug. 17, 1981 [JP] Japan .................. 56-121072[U]

[51] Int. Cl.[4] ............................................ H03K 17/00
[52] U.S. Cl. ................................. 307/117; 307/362; 361/165
[58] Field of Search .............. 361/165; 307/117, 362; 219/499; 323/366, 245

[56] References Cited

U.S. PATENT DOCUMENTS 3,553,429  6/1971  Nelson .................. 219/499

FOREIGN PATENT DOCUMENTS 68806  6/1981  Japan .................. 307/117

*Primary Examiner*—William H. Beha, Jr.
*Attorney, Agent, or Firm*—Guy W. Shoup

[57] ABSTRACT

A thermosensitive switching circuit includes a first voltage divider for producing a reference voltage with a predetermined constant level and a second voltage divider for producing a detection voltage signal whose level changes in response to changes in the temperature to be detected. The reference voltage is compared with the detection voltage signal by a voltage comparator having an open-collector type output circuit, and a feedback resistor is connected between the output terminal and the input terminal of the voltage compartor to provide hysteresis for the comparing operation of the voltage comparator.

3 Claims, 2 Drawing Figures

THERMOSENSITIVE SWITCHING CIRCUIT HAVING COMPARATOR WITH OPEN COLLECTOR OUTPUT

The present invention relates to a thermosensitive switching circuit for controlling various devices in response to detected temperature.

For example, for the purpose of automatically controlling a car air-conditioner so as to maintain the temperature in the car at a desired value, a thermosensitive switching circuit responsive to the temperature in the car is commonly used for turning the car air-conditioner ON and OFF. Such a thermosenistve switching circuit has a hysteresis characteristic, so that the set temperature at which the switching state of the thermosensitive switching circuit is changed from OFF state to ON state is different from the temperature at which the switching state is changed from ON state to OFF state. In the prior art, such thermosensitive switching circuits have been arranged to include a voltage comparator, and require a plurality of precise adjusting resistors in order to precisely set the desired controlling characteristics. Therefore, much time for adjusting the circuit to obtain the desired controlling characteristic has been required. In fact, the adjusting operation has been so complicated as to increase the manufacturing cost.

It is, therefore, an object of the present invention to provide an improved thermosensitive switching circuit in which the number of adjusting resistors required can be reduced as compared with the conventional circuit to remarkably improve the accuracy of the controlling operation.

It is another object of the present invention to provide a thermosensitive switching circuit wherein the adjusting operation for getting a desired controlling characteristic is simple.

According to the present invention, there is provided a thermosensitive switching circuit comprising a direct current voltage source, a first voltage divider for producing a reference voltage with a predetermined constant level by dividing the voltage of the direct current voltage source by the use of resistors, and a second voltage divider including a thermosensitive resistor to detect the temperature for producing a detection voltage signal the level of which is changes in response to changes in the temperature to be detected, the second voltage divider being connected to the direct current voltage source. In order to compare the reference voltage with the detection voltage signal, the circuit has a voltage comparator having an open-collector type output circuit and a feedback resistor connected between the output terminal and the input terminal of the voltage comparator whereby to provide a hysteresis characteristic to the comparing operation of the voltage comparator.

The output voltage of the voltage comparator is applied to a circuit for controlling a current flowing through a device to be controlled, and the controlling circuit is operated in response to the level changes in the output voltage of the voltage comparator.

By the use of this circuit arrangement, the number of precision resistors required is decreased and the adjustment of the resistance values simplified. Moreover, since it is possible to decrease the number of resistors by which the determination of the resistance value of the thermosensitive resistor is effected, a circuit in which the adjustment of the resistance value is not required can be realized by the use of the thermosensitive switching circuit of the present invention. As a result, the manufacturing cost is remarkably reduced and the controlling characteristics are improved.

Figure 2:
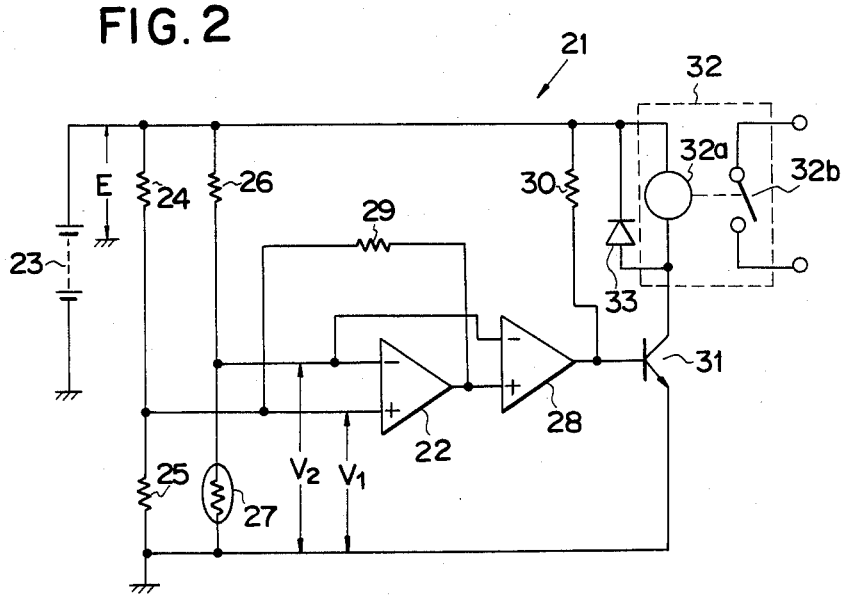

Further objects and advantages of the present invention will be apparent from the following detailed description to be read in conjunction with the accompanying drawings in which:

FIG. 1 is the circuit diagram of a conventional thermosensitive switching circuit; and FIG. 2 is the circuit diagram of an embodiment of a thermosensitive switching circuit of the present invention.

Prior to describing the present invention, a conventional thermosensitive switching circuit will be described in conjunction with FIG. 1. The conventional thermosensitive switching circuit 1 has a voltage comparator 2 having a negative input terminal to which a voltage $V_S$ is applied and a positive input terminal to which a voltage $V_T$ is applied. The voltage $V_S$ is obtained by dividing the terminal voltage E of a battery 3 by means of resistors 4 and 5, and the voltage $V_T$ is obtained by dividing the terminal voltage E by means of a resistor 6 and a thermistor 7 which is used as a thermosensor for detecting the temperature at a desired location. The output terminal of the voltage comparator 2 is connected through resistors 8 and 9 to the positive terminal of the battery 3, and the connecting point of the resistors 8 and 9 is connected to the base of a transistor 10. The collector of the transistor 10 is grounded through a relay coil $11_a$ of an electromagnetic relay 11 and the emitter of the transistor 10 is connected to the positive terminal of the battery 3.

In order to provide a hysteresis characteristic to the operation of the voltage comparator 2, the collector voltage of the transistor 10 is fed back to the negative input terminal of the voltage comparator 2 through a resistor 12. A normally open type relay switch $11_b$ is closed in response to the energization of the relay coil $11_a$ when the transistor 10 is turned ON. Since a diode 13 is connected in parallel with the relay coil $11_a$, the inverse e.m.f. produced across the relay coil $11_a$ when the transistor 10 is turned OFF can be effectively suppressed.

With the circuit arrangement described above, since the resistance value of the thermistor 7 varies in accordance with the temperature at the place where the thermistor 7 is placed, the level of the output voltage $V_O$ of the voltage comparator 2 becomes low when $V_T \leq V_S$, and the level of the output voltage $V_O$ becomes high when $V_T > V_S$.

In this case, assuming that the collector-emitter voltage $V_{CE}$ of the transistor 10 is zero for the ON state of the transistor 10, the value $V_{S/L}$ of the voltage $V_S$ when the level of the voltage $V_O$ is low can be written as:

$$V_{S/L} = \frac{R_5(R_4 + R_{12})}{R_4 R_5 + (R_4 + R_5)R_{12}} \times E \qquad (1)$$

wherein, $R_4$, $R_5$ and $R_{12}$ represent the resistance values of the resistors 4, 5 and 12, respectively.

On the other hand, the voltage $V_T$ can be expressed by the following equation when the resistance values of the resistor 6 and the thermistor 7 are represented by $R_6$ and $R_7$, respectively:

$$V_T = \frac{R_7}{R_6 + R_7} \times E \quad (2)$$

When $V_T$ becomes equal to or more than $V_S$ because of an increase in the value $R_7$ of the thermistor 7, the level of the voltage $V_O$ becomes high. In this case, it is necessary for the value $R_7$ to satisfy the following relationship.

$$R_7 \geq \frac{R_6 R_5 (R_4 + R_{12})}{R_4 R_{12}} \quad (3)$$

In the case that the level of the voltage $V_O$ changes from high to low, if the resistance value of the relay coil $11_a$ is not taken into consideration, the value $V_{S/H}$ of the voltage $V_S$ when the level of the voltage $V_O$ is high can be written as:

$$V_{S/H} = \frac{R_5 R_{12}}{R_4 R_5 + (R_4 + R_5) R_{12}} \times E \quad (4)$$

The level of the output voltage $V_O$ becomes low when $V_T$ becomes equal to or less than $V_S$ because of a decrease in the value $R_7$ of the thermistor 7. In this case, it is necessary for the value $R_7$ to satisfy the following relationship:

$$R_7 \leq \frac{R_5 R_6 R_{12}}{R_4 (R_5 + R_{12})} \quad (5)$$

As will be seen from the foregoing description, the conditon for turning OFF the transistor 10 is shown by the equation (3) and the condition for turning ON the transistor 10 is shown by the equation (5). That is, it follows that these conditions are determined by adjusting the values of $R_4$, $R_5$, $R_6$ and $R_{12}$. Therefore, for precise temperature control operation by the use of the circuit shown in FIG. 1, high precision resistors must be used for these four resistors 4, 5, 6 and 12. Also, it is necessary for obtaining a precision controlling operation to provide adjusting means for obtaining the designed resistance value for each resistor. This will cause the manufacturing cost of the device to increase.

Referring to FIG. 2, there is shown the circuit diagram of an embodiment of a thermosensitive switching circuit of the present invention. This thermosensitive switching circuit 21 is adapted to control the current flowing through a car air-conditioner by ON/OFF switching operation in response to the temperature in the car. The thermosensitive switching circuit 21 has a first voltage comparator 22 whose output circuit is arranged as a open-collector type circuit, e.g. the commercially available Signetics NE522 differential comparator, and the first voltage comparator 22 has a positive input terminal to which a voltage $V_1$ is applied and a negative input terminal to which a voltage $V_2$ is applied. The voltage $V_1$ is a voltage obtained by dividing the terminal voltage E of a battery 23 by means of resistors 24 and 25, and the voltage $V_2$ is a voltage obtained by dividing the terminal voltage E by means of a resistor 26 and a thermistor 27 which is used as a thermosensor for detecting the temperature at a desired location or of a desired object.

A second voltage comparator 28 is provided following the first voltage comparator 22, and the positive input terminal of the second voltage comparator 28 is connected to the output terminal of the first voltage comparator 22. The negative input terminal of the second voltage comparator 28 is connected to the negative input terminal of the first voltage comparator 22 to provide the voltage $V_2$ to the negative input terminal of the second voltage comparator 28. This arrangement maintains a high input impedance of the driving circuit seen from the output terminal of the first voltage comparator 22.

In order to provide a hysteresis characteristic to the operation of the circuit 21, a feedback resistor 29 is connected between the output terminal and the positive input terminal of the first voltage comparator 22.

The output terminal of the second voltage comparator 28 is connected through a resistor 30 to the positive terminal of the battery 23 and the base of a transistor 31. The collector of the transistor 31 is connected through the relay coil $32_a$ of an electromagnetic relay 32 to the positive terminal of the battery 23 and the emitter of the transistor 31 is grounded.

The electromagnetic relay 32 has a normally open type relay switch $32_b$ which is closed in response to the energization of the relay coil $32_a$ when the transistor 31 is turned ON. Since a diode 33 is connected in parallel with the relay coil $32_a$, the inverse e.m.f. produced across the relay coil $32_a$ when the transistor 31 is turned OFF can be effectively suppressed.

The thermistor 27 is provided at a suitable position within the car in which the temperature control is to be effected by the car air-conditioner and the resistance value $R_{27}$ of the thermistor 27 is changed in accordance with the ambient temperature $T_a$ in the car. Since the thermistor 27 has a negative temperature coefficient, the level of the voltage $V_2$ increases(decreases) as the ambient temperature $T_a$ decreases (increases). On the other hand, the value of the voltage $V_1$ is set to the level corresponding to the desired set temperature $T_o$ by the adjustment of the resistance values $R_{24}$ and $R_{25}$ of the resistors 24 and 25. Therefore, when the level of the voltage $V_2$ becomes less than that of the voltage $V_1$ in the case of $T_a > T_o$, the output level of the voltage comparator 22 becomes high. As a result, the output level of the voltage comparator 28 also becomes high to turn ON the transistor 31, and the relay coil $32_a$ is energized so that the relay switch $32_b$ is closed. On the other hand, when the level of the volage $V_2$ becomes larger than that of the voltage $V_1$ in the case of $T_a < T_o$, the transistor 31 is turned OFF to open the relay switch $32_b$. The relay switch $32_b$ is connected to the power supply controlling circuit of the air-conditioner(not shown) and the air-conditioner is controlled by the circuit 21 in response to the temperature in the car.

In this case, the level of the voltage $V_1$ depends upon the level state of the output terminal of the first voltage comparator 22 because of the feedback resistor 29. That is, although the level of the voltage $V_1$ is determined only by the resistance values of the resistors 24 and 25 when the output level of the first voltage comparator 22 is high since the first voltage comparator 22 is of the open-collector type, the level of the voltage $V_1$ furthermore depends upon the resistance value of the resistor 29 in addition to that of the resistors 24 and 25 when the output voltage of the first voltage comparator 22 is low. Thus, a hysteresis characteristic is provided to the comparing operation of the first voltage comparator 22 by the feedback resistor 29.

With this circuit arrangement, since the first voltage comparator 22 has an open-collector type output circuit, the level $V_{1H}$ of the voltage $V_1$ when the level of the output voltage of the first voltage comparator 22 is high is expressed as follows:

$$V_{1H} = \frac{R_{25}}{R_{24} + R_{25}} \times E \quad (6)$$

On the other hand, $V_2$ can be represented by the following relationship:

$$V_2 = \frac{R_{27}}{R_{26} + R_{27}} \times E \quad (7)$$

wherein, $R_{26}$: resistance value of the resistor 26,
$R_{27}$: resistance value of the thermistor 27.

Therefore, the condition whereunder the output voltage level of the first voltage comparator 22 changes from high to low when the resistance value $R_{27}$ of the thermistor 27 increases is as follows:

$$R_{27} \geqq \frac{R_{25}R_{26}}{R_{24}} \quad (8)$$

Assuming the saturation voltage of the first voltage comparator 22 on the low level side to be zero, the value $V_{1L}$ of the voltage $V_1$ when the output voltage level of the first voltage comparator 22 is low may be expressed as follows:

$$V_{1L} = \frac{R_{25}R_{29}}{R_{24}(R_{25} + R_{29}) + R_{25}R_{29}} \times E \quad (9)$$

wherein, $R_{29}$ is the resistance value of the resistor 29.

Therefore, the condition whereunder the output voltage level of the first voltage comparator 22 changes from low to high when the value $R_{27}$ decreases is as follows:

$$R_{27} \leqq \frac{R_{25}R_{26}R_{29}}{R_{24}(R_{25} + R_{29})} \quad (10)$$

As is obvious from the foregoing description, the condition under which the transistor 31 is turned ON when the value $R_{27}$ decreases with an increase in temperature $T_a$ is expressed by the equation (10). On the other hand, the condition under which the transistor 31 is turned OFF when the value $R_{27}$ increases with decrease in the temperature $T_a$, is expressed by the equation (8). Consequently, in the thermosensitive switching circuit shown in FIG. 2, it follows that the resistance value $R_{27}$ of the thermistor 27 at which the transistor 31 is turned OFF is determined in relation to the values of three resistors 24, 25 and 26, so that the number of resistors necessary for adjusting the circuit characteristics can be reduced as compared with the conventional circuit. That is, although the number of adjustable conditions is $16(=2^4)$ in the conventional circuit since the number of resistors for adjustment of the temperature characteristics is four, the number of states adjustment of the circuit of FIG. 2 is eight $(=2^3)$ since the number of elements for adjusting the condition for turning OFF the transistor 31 is three. Consequently, the circuit adjustment will be simplified.

On the other hand, the condition of the value $R_{27}$ under which the transistor 31 is turned ON depends upon the values of four resistors. However, since the value $R_{29}$ does not depend upon the condition for turning OFF the transistor 31 but only upon the condition for turning ON the transistor 31, there is the advantage that the adjustment of the resistance value $R_{29}$ can be independently carried out after the adjustment for the turning OFF condition of the transistor 31.

The use of this circuit arrangement reduces the number of precision resistors required and simplifies the adjustment of the resistance values. The relationship of the resistances given in equations (6)–(10) above is obtainable through the arrangement of the first and second voltage comparators. Moreover, since it is possible to decrease the number of resistors by which the determination of the resistance value of the thermistor 27 is effected, a circuit requiring no adjustment of resistance value can be realized by the use of the thermosensitive switching circuit of the present invention. As a result, the manufacturing cost will be remarkably reduced and the controlling characteristics are improved.

The thermosensitive switching circuit according to this embodiment can be used not only for controlling an air-conditioner to make the car interior comfortable but also for preventing the evaporator of an air-conditioner from freezing. Moreover, it makes it easily possible to realize a high precision control since the adjusting operation for obtaining the desired controlling characteristics based on the temperature detected by the thermistor is simplified.

Although the circuit 21 shown in FIG. 2 is used to control a car air-conditioner, the present invention is not limited to such use but is widely applicable to other devices.

In the embodiment described above, an NPN transistor is employed as the transistor for driving the electromagnetic relay. However, a PNP transistor may also be used for the same purpose.

Also; the manner in which the voltages $V_1$ and $V_2$ are applied to the input terminal of the first voltage comparator 22, is a mere matter of circuit design and it is possible within the scope of the present invention to arange the thermosensitive switching circuit in such a way that the voltages $V_1$ and $V_2$ are applied to the negative and the positive input terminals of the first voltage comparator 22, respectively.

Moreover, although a thermistor is used as the thermosensitive resistor in this embodiment, it is also possible to construct the thermosensitive switching circuit of the present invention using a thermosensitive resistor having a positive temperature coefficient, e.g. a posistor.

We claim:

1. A thermosensitive switching circuit, comprising;
a direct current voltage source;
means including a first voltage divider for producing a reference voltage with a predetermined constant level by dividing the voltage of said direct current voltage source by the use of resistors;
means including a second voltage divider including a thermosensitive resistor for detecting temperature by dividing the voltage of said direct current voltage source to produce a detection voltage signal whose changes in response to changes in the temperature to be detected;
means including a first voltage comparator for comparing the level of said reference voltage with the level of said detection voltage signal, said first voltage comparator having an open-collector type output circuit;

means including a feedback resistor connected between an output terminal and an input terminal of said first voltage comparator to provide a hysteresis characteristic to the comparing operation of said first voltage comparator;

means including a second comparator responsive to the change in the output level of said first voltage comparator; and a switching means which is closed or opened in response to the change in the output level of said second voltage comparator for controlling current to a device to be controlled.

2. A thermosensitive switching circuit as claimed in claim 1 wherein said first voltage divider is composed of two resistors connected in series to divide the terminal voltage of said voltage source in accordance with the ratio of the resistance value of these resistors and to obtain said reference voltage and said second voltage divider is composed of said thermosensitive resistor and a resistor connected in series with said thermosensitive resistor and divides the terminal voltage of said voltage source in accordance with the ratio of the resistance values of the resistor and the values of the thermosensitive resistor at that time to obtain said detection voltage signal.

3. A thermosensitive switching circuit as claimed in claim 2 wherein said reference voltage from said first voltage divider is applied to the positive input terminal of said first voltage comparator, said detection voltage signal is applied to the negative input terminal of said first voltage comparator, and one end of said feedback resistor is connected to said positive input terminal of said first voltage comparator.

* * * * *